United States Patent [19]

Gluckstern et al.

[11] Patent Number: 4,538,130
[45] Date of Patent: Aug. 27, 1985

[54] TUNABLE SEGMENTED RING MAGNET AND METHOD OF MANUFACTURE

[75] Inventors: Robert L. Gluckstern, College Park, Md.; Ronald F. Holsinger, Carlisle; Robert R. Lown, Billerica, both of Mass.

[73] Assignee: Field Effects, Inc., Acton, Mass.

[21] Appl. No.: 602,761

[22] Filed: Apr. 23, 1984

[51] Int. Cl.³ .............................................. H01F 7/02
[52] U.S. Cl. .................................. 335/306; 335/212; 335/298; 250/396 ML
[58] Field of Search ............... 335/210, 211, 212, 306, 335/304; 250/396 ML; 252/62.57

[56] References Cited

U.S. PATENT DOCUMENTS

| | | | |
|---|---|---|---|
| 2,854,607 | 9/1958 | Niklas et al. | 335/306 X |
| 3,623,151 | 11/1971 | Ikeuchi | 335/212 |
| 3,671,895 | 6/1972 | Aucouturier et al. | 335/212 |
| 4,429,229 | 1/1984 | Gluckstern | 335/212 X |

OTHER PUBLICATIONS

N. V. Lazarev, V. S. Skachkov, 1979 Linear Accelerator Conference, The Tipless Permanent Magnet Quadrupole Lenses, Institute for Theoretical and Experimental Physics-Moscow, USSR.

Klaus Halback, Perturbation Effects in Segmented Rare Earth Cobalt Multipole Magnets, Lawrence Berkeley Laboratory, Univ. of California, Berkeley, CA, LBL-13221, Exhibit 10, pp. 1-8.

R. D. Hay, C. G. Masi, A Variable Strength Permanent Magnet Dipole, New England Nuclear Corporation, Chelmsford, MA 01824, U.S.A., Exhibit 13, pp. 84-86.

Primary Examiner—George Harris
Attorney, Agent, or Firm—Lahive & Cockfield

[57] ABSTRACT

A segmented permanent ring magnet which is tunable to provide a preselected transverse magnetic field within the magnet interior is disclosed. The permanent magnet is constructed of material which has essentially linear behavior in the second quadrant of the B-H curve. The invention includes a method of tuning a segmented permanent ring magnet and a method of manufacture for the blocks of magnetic material which make up the magnet. The magnets of the present invention are particularly adapted for use as bias magnets in NMR imaging systems.

24 Claims, 5 Drawing Figures

TUNABLE SEGMENTED RING MAGNET AND METHOD OF MANUFACTURE

BACKGROUND OF THE INVENTION

The present invention relates to improvements in segmented ring magnets. More particularly, it provides a segmented permanent ring magnet which is tunable to provide a preselected transverse magnetic field within its interior.

The development of nuclear magnetic resonance (NMR) as a tool for medical and biological imaging has generated a new interest in magnet development. NMR imaging systems have four major parts: a bias field magnet, gradient coils for spatial location, an R-F coil which causes a short term perturbation of the nuclear magnetic moments of a specimen material within the magnet, and a receiver. The bias field magnet provides a relatively large, preselected field, e.g., a substantially uniform transverse field, within the interior of the magnet. The bias field promotes alignment of the nuclear magnetic moments of nuclei in the specimen material parallel to the applied field. This alignment causes a change in the magnetic state of the material. Significant magnetic fields. e.g., one to five kilogauss, generally are needed to achieve the desired alignment.

Typically, the X, Y, and Z gradient coils are used to cause directional perturbations in the magnetic field, e.g., the X-coil causes a gradient in the X-direction. These gradient coils are pulsed, individually or collectively, at intervals set by a sequencer to provide the spatial information necessary for image reconstruction. The gradient coils cause perturbation in the magnetic field pattern so that only one field location, e.g., a plane, is unperturbed. The NMR receiver scans the magnetic field and obtains the spatial information necessary for reconstruction of an image by the location of the unperturbed regions.

The R-F coil is turned on by the sequencer for a short period after alignment of the magnetic moments of the nuclei by the bias field. The R-F coil causes a perturbation or excitation in the magnet field which displaces the nuclear magnetic moments of the nuclei from their aligned position. Once the excitation field from the R-F coil is removed, the nuclear magnetic moments of the nuclei revert back to their aligned position in response to the applied bias field. The receiver, which measures the strength of the signal which results from the realignment of the nuclear magnetic moments over time, is used to determine the time constant of this reversion. The differences in the strength of the signal and the time constant, factors which vary from material to material, make it possible to identify the different properties of the specimen materials within the person or sample being analyzed. The R-F coil may also be used as the receiver.

A major problem of such prior NMR imaging systems for use with a human specimen is the construction of the bias magnet. This magnet it to have sufficient field strength to promote alignment of the magnetic moments of the nuclei and yet have a large bore size. The large bore is necessary to accomodate a major portion of the human body, at least the head and shoulders, within the field. If other properties of the magnet are kept constant, the magnetic field strength decreases with increasing bore size, so the design problems associated with a high field, large bore magnet are significant.

The problems of producing a bias field sufficient for biological applications across a large bore led the developers of the first NMR imaging systems to use superconducting bias magnets. While superconducting bias magnets can easily produce the needed field, there are several problems with the use of these magnets. First, expensive cryogenic equipment is required to maintain the superconducting state. Second, if the superconducting material becomes conductive, e.g., by a rise in temperature, the magnetic field strength deteriorates rapidly. These complications have led to attempts to develop NMR imaging systems using permanent magnets. For example, Fonar Corporation uses a permanent magnet system which produces a dipole magnetic field. The perturbations in this dipole magnetic field can be reconstructed by a computer to provide the information sought. Oldendorf Magnet Technology has constructed a model magnet for an NMR imaging system of a ferrite permanent magnet material. However, neither of these systems yields imaging which is sufficiently detailed for many medical applications.

The rare earth alloys and related materials show promise for use in the construction of bias field permanent magnets for NMR imaging systems. These materials have essentially linear behavior in the second quadrant of the plot of the B-H relationship, which is the graph of the demagnetization-applied field strength relation. These materials do not have a large hysteresis loop in the region of interest, e.g., in contrast to the hysteresis loop observed for soft iron. Therefore, once these materials have been magnetized, the strength of the field and the orientation of the easy axis of magnetization, i.e., the direction of the magnetic field of the material, stay substantially constant over a wide variety of conditions. Materials which exhibit these properties include rare earth cobalt alloys, ceramic ferrite alloys, and rare earth iron alloys. These materials normally are manufactured by placing a finely ground powder of the material in a mold and simultaneously subjecting the powder to pressure and an applied magnetic field. This procedure forms the powder into a solid block having a substantially aligned easy axis of magnetization.

There are several problems associated with the foregoing use of the rare earth alloy-like materials as a source of the bias field of an NMR imaging device. First, the field strength from these magnets is not as great as can be obtained from superconducting magnets. This means that the size of the bore is more critical. Second, the comparatively high cost of these materials, approximately $30–45/pound, limits the size and weight of the magnet. If the permanent magnet material weighs more than about 10,000 pounds, the cost of the magnet may be prohibitive for use in NMR imaging systems. At weights lower than 5,000 pounds, the bore must be made too small to be useful for human imaging or the field is too low. The approximate 10,000 pound limit appears to provide a commercially reasonable compromise between cost and field strength. Third, the sizes of the pieces of the rare earth alloy-like material which can be manufactured and magnetized using current techniques are substantially smaller than the required size of this large magnet. Therefor, a magnet is formed of a plurality of segments. Each segment is, in turn, formed of a plurality of pieces of magnetic material. In addition, non-uniformities stemming from the magnetization process can cause harmonic inaccuracies in the resultant magnetic field.

Accordingly, an object of this invention is to develop a tunable segmented ring magnet of a permanent magnetic material which produces a preselected transverse magnetic field in the interior of the ring structure. Another object is to provide a method of tuning a segmented permanent ring magnet to achieve a preselected transverse field in the interior of the ring. A further object is to provide a method of fabricating a magnet segment having a preselected easy axis of magnetization. A still further object is to provide a permanent magnet formed of a rare earth alloy-like material which is useful as a bias magnet in an NMR imaging system. These and other objects and features of the invention will be apparent from the following description and the drawing.

SUMMARY OF THE INVENTION

The present invention features a tunable segmented ring magnet extending along a magnet axis perpendicular to the plane of the ring. The ring defines a torus surrounding the interior space. The magnet produces a preselected transverse magnetic field in the interior space. The magnet includes a first plurality of inner magnet segments disposed about said ring and extending along the magnet axis. Each inner magnet segment is formed of a permanent magnetic material having essentially linear behavior in the second quadrant of the B-H curve and has an easy axis of magnetization in a predetermined orientation. The magnet also has a second plurality of outer magnet segments located radially outward from the inner segments. Each of the outer segments is formed of a permanent magnetic material having essentially linear behavior in the second quadrant of the B-H curve and has an easy axis of magnetization in a predetermined orientation. The magnet also has a tuning mechanism for moving at least one of the magnet segments radially relative to the ring to produce the preselected transverse magnetic field in the interior space.

In one embodiment, the segmented ring magnet is a ring dipole magnet, preferably having each inner magnet segment and outer magnet segment formed of a plurality of blocks of the magnetic material. These blocks may have trapezoidal or rectangular cross-sections in a plane perpendicular to the axis of the magnet, but square cross-sections are preferred. The magnet has N inner magnet segments and M outer magnet segments. The inner segments are formed of a plurality of blocks having square cross-sections wherein each block has a plurality of faces with an edge length $\lambda a$ where "a" is the distance between the center of the ring to the innermost face of the block and ($\lambda = \tan \pi/N$). The outer segments can also be formed of a plurality of blocks. In one embodiment, each outer block has a square cross-section, and has an edge length of $(\lambda(1+\lambda)a)$, and N equals M.

Magnetic materials useful for the invention have essentially linear behavior in the second quadrant of the B-H curve and are selected from a group consisting of rare earth cobalt alloys, ceramic ferrite alloys, and rare earth iron alloys. Illustrative specific materials found satifactory are NEOMAX-30H (Sumitomo, Japan), CRUMAX-35 (Crucible, USA), and SEREM-R28E (Shin-ETSU, Japan).

Preferably, the tuning mechanism moves the outer segments radially relative to the ring. The preferred preselected transverse field is a substantially uniform transverse field in the plane of the ring, and the tuning mechanism can be used to diminish harmonics in the magnetic field caused by non-uniformity in the material forming the inner and outer magnet segments. In a preferred embodiment of the invention, the number N of inner magnet segments equals the number M of outer magnet segments.

The invention also features a method of tuning a segmented permanent ring magnet having a ring of N substantially uniform inner segments to yield a preselected transverse magnetic field in the interior of the ring. Each inner segment is formed of a permanent magnetic material having essentially linear behavior in the second quadrant of the B-H curve with an easy axis of magnetization in a predetermined orientation. The method includes the steps of providing M substantially uniform further magnet segments located radially outward from the N inner segments and adjusting the location of at least one of the magnet segments to achieve the preselected transverse magnetic field. The adjustment can include the additional steps of setting the position of the inner segments to obtain the optimum magnetic field pattern and strength and adjusting the position of one or more further magnet segments to obtain the preselected transverse magnetic field. Preferably, the adjustments include measuring the magnetic field for conformity to the preselected transverse magnetic field, fixing one of the further magnet segments at its innermost position, and individually adjusting the other unfixed further segments to approach the preselected transverse magnetic field by eliminating unwanted harmonics. Preferably, each adjustment of the unfixed further segments is constrained to be an outward radial movement. This method can be used to form a substantially uniform transverse magnetic field in the plane of the ring.

The invention further features the method of fabricating a multipart rectangular-shaped permanent magnet having an easy axis of magnetization oriented at a selected angle relative to the easy axis of magnetization of its constituent parts. The fabrication method includes the steps of providing a rectangular-shaped magnet block with an easy axis of magnetization parallel to a first surface thereof and cutting the magnet block through the first surface. The cut passes through an edge of the magnet block and is oriented at a selected angle relative to the easy axis of magnetization of the magnet block. The cut divides the rectangular-shaped magnet block into a first element and a second element with each element including a portion of the first surface. The first element formed by the cut through the first surface of the magnet block is recut through the remaining portion of the first surface and through an edge of the original magnet block at an angle perpendicular to the surface formed by the first cut. This cut forms a third element and a fourth element. The second, third, and fourth elements are reassembled to form a new rectangular-shaped magnet block. The new rectangular-shaped magnet block has an easy axis of magnetization rotated by the selected angle relative to the easy axis of magnetization of the original magnet block. In one embodiment, the rectangular-shaped magnet block is a prism having a square cross-section and preferably is assembled of a plurality of rectangular geometric solids each having an easy axis of magnetization parallel to the first surface. The geometric solids are assembled to form the prism in such a manner that the easy axis of magnetization of each geometric solid is aligned parallel to each other and the easy axis of magnetization of the prism. Preferably, the easy axis of magnetization of the rectangular-shaped magnet block is substantially parallel to an edge of the magnet block and the selected angle is constrained to values of 360/R degrees where R is an integer greater than one.

While the magnet structures disclosed herein and the methods of tuning the magnet and fabricating the rectangular-shaped magnet block with an easy axis of magnetization oriented in a chosen direction are especially well adapted to NMR imaging systems, these magnet structures may be used for other applications. Broadly, the concept of the invention is to develop a ring permanent magnet which produces a preselected, preferably uniform, transverse magnetic field in a plane parallel to the ring of the magnet.

DESCRIPTION OF THE ILLUSTRATED EMBODIMENTS

As noted, conventional ring magnets heretofore formed of permanent magnetic materials have a number of problems. The material used to produce high fields across the large bore needed for NMR imaging systems is expensive, while smaller fields may not have sufficient uniformity or strength to accomplish the desired purpose. An optional shape for a ring magnet used in NMR imaging systems is a cylindrical magnet having a bore of at least 80 cm in diameter, thereby allowing full human body insertion. However, it is not practical with present technology to make a unitary ring magnet with this size bore. Therefore, segmented rings are used to accomplish the requisite field and bore. The use of segmented rings leads to problems in orienting the easy axis of magnetization for each segment, as well as errors in the magnetization strength of each segment from errors in magnetization in the plates which form the blocks. There also may be errors in the radial and transverse positions of the segments of the final magnet. These errors can lead to harmonic variations in the magnetic field. These harmonic variations must be substantially eliminated to achieve the preselected, preferably uniform, magnetic field across the bore. The present invention provides a permanent magnet which is tunable to remove the major harmonics, a method of tuning such a magnet, and a method of fabricating polyhedral blocks of permanent magnetic material which can be used to form the segments.

Prior permanent segmented ring multipole magnets were formed of trapezoidal blocks of magnetic material. One problem with the use of the prior trapezoidal blocks for dipole ring magnets is that for a magnet having N segments, one needs (N/4+1) easy axes of magnetization to produce a unidirectional transverse magnetic field. Since the error in the angle of magnetization for each block of magnetic material typically may be plus or minus three degrees, for a small N (the segmented ring), there could be significant errors in field uniformity.

Another problem associated with the prior use of trapezoidal blocks is that the tuning procedure requires delicate adjustments, e.g., movements in the order of 0.01 cm or less, to diminish the harmonics. These movements are delicate because the large field produced by the magnet tends to prevent movement. These tuning movements thus pose a significant engineering problem.

Figure 1:
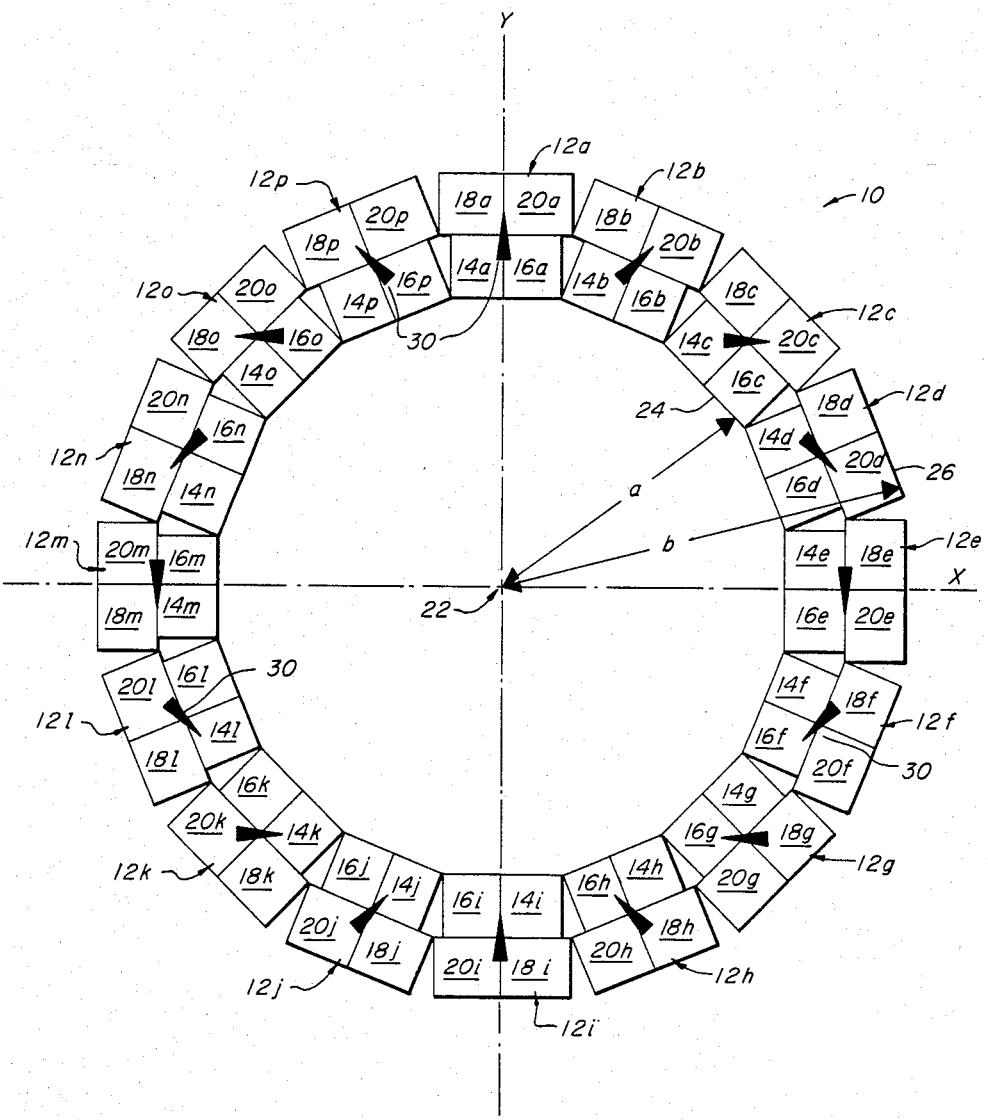
FIG. 1 illustrates a two-dimensional representation of a preferred embodiment of the invention in the form of a 16-segment ring magnet which is tunable to produce a substantially uniform transverse magnetic field in the Y direction.
Figure 2:
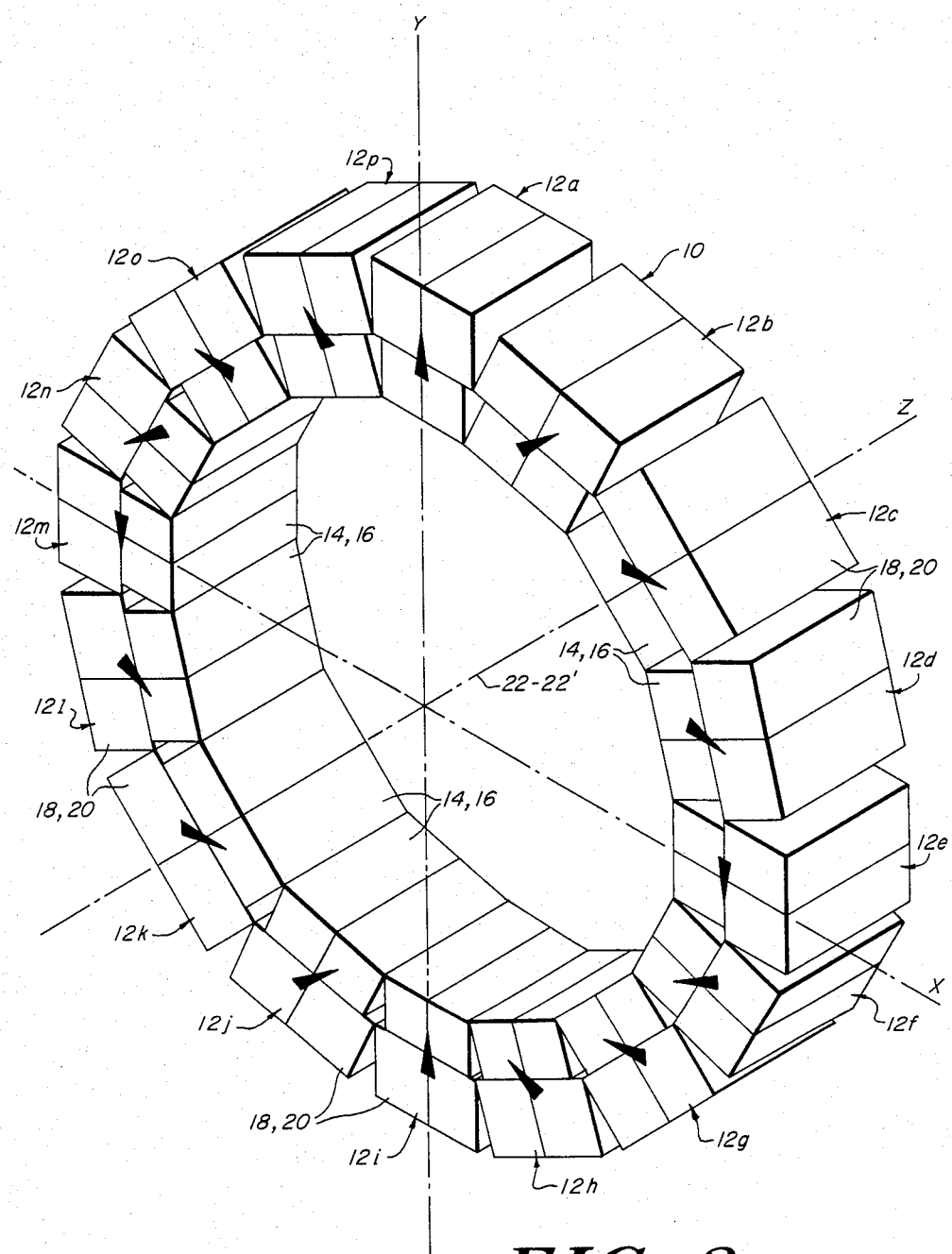
FIG. 2 illustrates a three-dimensional representation of the ring magnet of FIG. 1.

FIG. 1 illustrates a preferred embodiment of the invention in the form of a sixteen-segment dipole ring magnet 10. The Figure shows the magnet 10 in a two-dimensional (X-Y) representation but, as illustrated in FIG. 2, the segments extend perpendicular to the plane of the ring (the Z-direction). Each segment $12a-12p$ is formed of four blocks of magnetic material, each block having a square cross-section, arranged so there are two inner blocks, $14a-14p$ and $16a-16p$, surrounded by two outer blocks, $18a-18p$ and $20a-20p$. The distance "a" shown on FIG. 1 is the radius of the bore; that is, the distance from the ring center 22 to near edge 24 of any inner block. For an NMR imaging system, "a" would typically be approximately 40 cm. The edge length of inner blocks $14a-14p$ and $16a-16p$ is $\lambda a$ where $\lambda=\tan \pi/N$. For the illustrated embodiment, $\lambda=\tan \pi/16$ or approximately 0.2. Outer blocks $18a-18p$ and $20a-20p$ have edge dimensions of "$\lambda(1+\lambda)a$" or approximately 0.24a. The distance from the center of the bore 22 to the furthest edge 26 of any outer block, dimension "b" on FIG. 1, is approximately 1.44a ($b=a+0.2a+0.24a$). The block dimensions are chosen so that b/a equals $(1+\lambda)^2$. For a large N and constant b/a, the difference in the magnetic field between magnets manufactured with trapezoidal blocks and magnets as shown wherein the segments are constructed of square cross-section blocks, is approximately $(\pi^2/3N^2)$ so for N=16, this error is about 1.3%.

The use of four square blocks rather than a single trapezoidal block has a number of advantages. For example, the arrows 30 on FIG. 1 represent the easy axis of magnetization for each segment. Using square blocks, there are only three different orientations of the easy axes (N/8+1) needed in the sixteen segment case, as compared with five orientations needed for a sixteen member ring formed of trapezoidal pieces (N/4+1). The orientations for square blocks are 0°, 22½°, and 45°. The second and more important advantage of using four square cross-section blocks, or other combination of inner and outer blocks, is that the inner blocks $14a-14p$ and $16a-16p$ can be fixed at predetermined locations, and unwanted harmonics are removed by movements of the outer blocks alone. By restricting tuning movements to the outer blocks, grosser movements can be used to tune the magnet. This is because the inner blocks are more important to the strength and shape of the field than the outer blocks, so relatively large movements of the outer blocks cause desired small changes in the field strength. In contrast, for trapezoidal cross-section blocks, the entire mass of magnetic material must be moved so very fine adjustments (0.01 cm or less) must be made to the larger block of material. With the present invention, as illustrated, the grosser movements associated with the outer blocks in a multiple-layer magnet make modification of the field to eliminate unwanted harmonics much easier.

The following tuning procedure further illustrates the invention. All inner blocks 14a–14p and 16a–16p are positioned as close to the center of the ring as attainable, i.e. minimum a. This yields the maximal transverse magnetic field in the Y or upward direction for the magnet illustrated in FIG. 1. At the start of the tuning procedure, all of the outer blocks 18a–18p and 20a–20p are set as close to the inner blocks as attainable. While FIG. 1 shows the outer blocks positioned directly colinear, i.e. radially aligned, with and radially outward from the inner blocks, the invention is not limited to magnets where the inner and outer blocks are colinear nor is it necessary that the number of inner blocks equal the number of outer blocks. The field within the bore is measured for comparison with the preselected field, e.g., using a field probe, and a standard Fourier decomposition of the field is calculated, e.g., using a computer program, to determine the strength of the specific harmonics. In response to this data, the outer blocks of the segment which show the least need of movement are kept at their closest approach position, e.g., 18a and 20a, and the outer blocks of the other segments, e.g., 12b–12p are moved individually to eliminate the unwanted harmonics.

More specifically, it is possible to eliminate both sine $n\phi$ and cosine $n\phi$ polarization harmonics of harmonics n=2–8, and one polarization harmonic of harmonic 9, by setting the outer blocks of one segment at their innermost position and constraining all position adjustment of the other outer blocks to be radially outward. Between each adjustment, the field is remeasured to determine the next movement. Preferably, the outer blocks are mounted on a track or rail which permits ease of movement and small positional changes. Since the higher harmonics are less sensitive to the position of the outer ring, and the sensitivity of the field strength to the tenth harmonic is only one part in 10,000, harmonics higher than nine are not as important to remove. The tuning procedure described herein modifies the strength of the field by less than one percent while achieving excellent field uniformity in the transverse direction.

FIG. 2 shows a three-dimensional representation of the magnet of FIG. 1. This Figure clearly illustrates that the magnet is substantially symmetrical about a magnet axis 22—22' which passes through the ring center. Magnet axis 22—22' is the Z axis of a ring is constrained to be in an X-Y plane, as illustrated.

While a sixteen-segment ring magnet is shown in FIGS. 1 and 2, other numbers of segments, examples of which are 8, 12, 24 and 32, which produce the desired field pattern can be used.

Figure 3A:
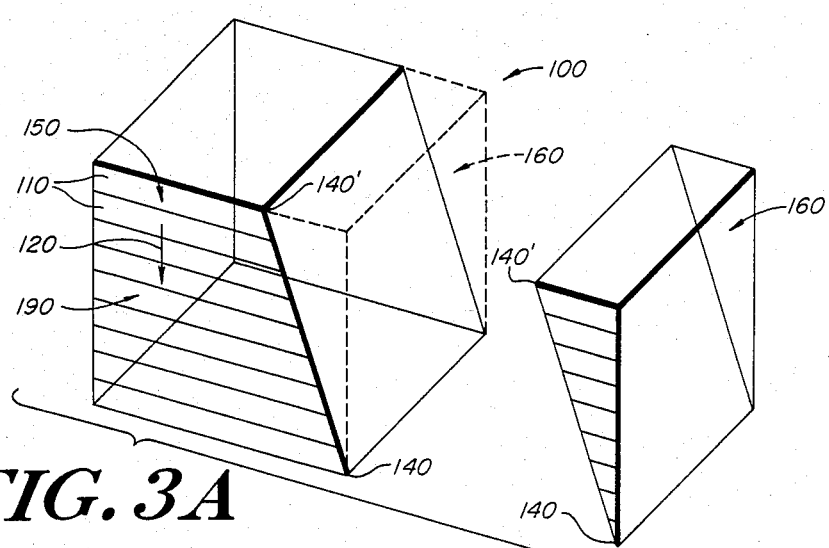
FIGS. 3a-3c illustrate a method of cutting and reassembling a square cross-section polyhedron of permanent magnetic material to provide a new polyhedron with square cross-section having an easy axis of magnetization rotated by a preselected angle relative to the easy axis of the original polyhedron.
Figure 3B:
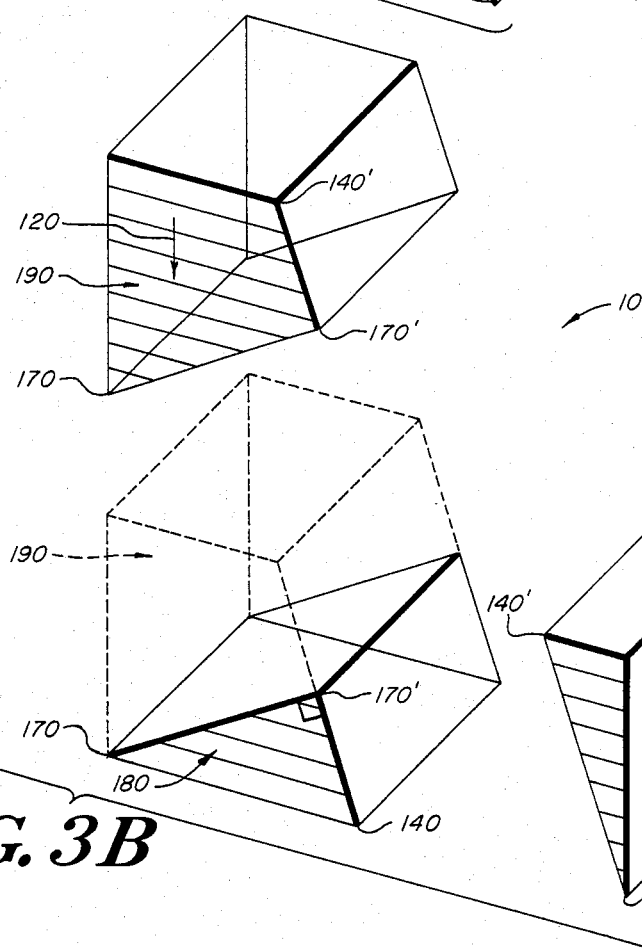
Figure 3C:
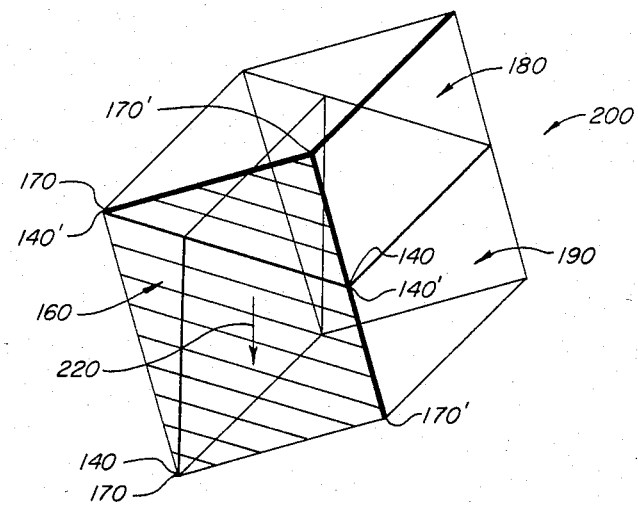

Although the blocks which make up the segments can be manufactured by conventional procedure, the following process, illustrated in FIGS. 3a–c, promotes simple and inexpensive manufacturing. As previously noted, most rare earth alloy-like magnetic materials, e.g., rare earth cobalt alloys, are manufactured by applying pressure and a magnetic field to a powder of particles placed in a mold. The standard size slabs or plates of material made by this process are approximately two inches by two inches by one-half inch. Block 100 in FIG. 3a is shown as made up of eight of these plates 110. The easy axis of magnetization 120 for the block is down (FIG. 3A). A block like this would be useful in constructing a magnet segment having an angle of 0°, one of the three orientations necessary in a sixteen member ring. To convert this block to another block having an easy axis of magnetization at a selected non-zero angle relative to the original angle of magnetization, e.g., a 22½° angle, a first cut 140—140' is made through first edge 140 to create two new elements, a first element 150 and a second element 160 (FIG. 3a). First cut 140—140' is at the desired angle (e.g., 22½°) relative to original easy axis of magnetization 120. First element 150 is then cut through second edge 170 at a second angle 170—170' perpendicular to first cut 140—140' (FIG. 3b). Second cut 170—170' separates first element 150 into third element 180 and fourth element 190. Second element 160, third element 180 and fourth element 190 are rearranged as shown in FIG. 3c to form new polyhedron 200. The easy axis of magnetization 220 of new block 200 is at the selected angle relative to easy axis of magnetization 120 of polyhedron 100.

Although this method of constructing the blocks of magnetic material is preferred, other methods which provides blocks having the proper easy axis orientation may be used in practicing the invention. The major advantage of this method is that it minimizes the number of cuts and, therefore, the amount of material wasted.

As is evident from the foregoing, the invention provides an improved tunable segmented permanent ring magnet of a rare earth alloy-like material which provides easier tuning and a more uniform field than has previously been available. The invention also provides an improved means of making magnetic blocks for use in such a magnet. Those skilled in the art may determine other variations and modifications of the concepts disclosed herein within the spirit and scope of the invention. Such other modifications and variations are included within the following claims.

What is claimed is:

1. A tunable segmented ring magnet extending along a magnet axis perpendicular to the plane of the ring configuration thereof, and defining a torus surrounding an interior space, said magnet producing a preselected magnetic field within said interior space transverse to said magnet axis, said magnet comprising A. a first plurality of inner magnet segments, each of said inner magnet segments being formed of a permanant magnetic material having essentially linear behavior in the second quadrant of the B-H curve and having an easy axis of magnetization in a predetermined orientation, B. a second plurality of outer magnet segments located radially outward from said inner magnet segments, each of said outer magnet segments being formed of a permanant magnetic material having essentially linear behavior in the second quadrant of the B-H curve and having an easy axis of magnetization in a predetermined orientation, and C. tuning means for moving at least one said magnet segment radially relative to said ring to produce a preselected transverse magnetic field in said interior space.

2. The segmented ring magnet according to claim 1 further characterized by having N inner magnet segments and M outer magnet segments, where N and M are integers.

3. The segmented ring magnet of claim 2 wherein said ring magnet comprises a ring dipole magnet.

4. The segmented ring magnet of claim 3 wherein each of said inner magnet segments comprises a plurality of blocks of a magnetic material.

5. The segmented ring magnet of claim 3 wherein each of said outer magnet segments comprises one or more blocks of magnetic material.

6. The segmented ring magnet of claim 3 wherein said inner and outer segments comprise blocks having trapezoidal or rectangular cross-sections.

7. The segmented ring magnet of claim 3 wherein each of said inner magnet segments comprises a plurality of blocks having square cross sections formed of permanant magnet material, each of said blocks having a plurality of faces with an edge length $\lambda a$ where $a$ is the distance between the center of said ring and the innermost face of each block and $\lambda$ equals the tangent of $\pi/N$.

8. The segmented ring magnet of claim 7 wherein each of said outer magnet segments comprises a plurality of blocks having square cross sections formed of said permanent magnetic material, each of said blocks having an edge length $\lambda(1+\lambda) a$, and N equals M.

9. The segmented ring magnet of claim 1 wherein said permanant magnetic material is selected from a group consisting of rare earth cobalt alloys, ceramic ferrite alloys, and rare earth iron alloys.

10. The segmented ring magnet of claim 1 wherein said tuning means comprises means for moving said outer magnet segments radially relative to said ring.

11. The segmented ring magnet of claim 1 wherein said preselected transverse field is a substantially uniform transverse field in the plane of the ring.

12. The segmented ring magnet of claim 11 wherein said tuning means comprises means to diminish harmonics in the magnetic field of said ring magnet caused by non-uniformity in the material forming said inner magnet segments and said outer magnet segments.

13. The segmented ring magnet of claim 2 wherein N equals M.

14. A method of tuning a segmented permanent ring magnet to achieve a preselected transverse magnetic field in the interior of said ring, said magnet having a ring of N substantially uniform inner magnet segments, each of said inner magnet segments formed of a permanant magnetic material having essentially linear behavior in the second quadrant of the B-H curve and having an easy axis of magnetization in a predetermined orientation, said method comprising the steps of
    providing M substantially uniform further magnet segments located radially outward of said inner magnet segments, and
    adjusting the location of at least one of said magnet segments to achieve said preselected transverse magnetic field.

15. The method of claim 14 wherein said adjusting step comprises the further steps of
    setting the position of said inner magnet segments to obtain an optimum magnetic field pattern and strength, and
    further adjusting the position of one or more of said further magnet segments to obtain said preselected transverse magnetic field.

16. The method of claim 15 wherein said further adjusting step comprises measuring said magnetic field for conformity to said preselected transverse magnetic field, fixing one of said further magnet segments at its innermost position, and individually adjusting each of said M-1 unfixed further magnet segments individually to approach said preselected transverse magnetic field by eliminating unwanted harmonics.

17. The method in claim 16 wherein each of the adjustments of said M-1 unfixed further magnet segments is constrained to be an outward radial adjustment.

18. The method of claim 14 wherein said preselected transverse magnetic field comprises a substantially uniform transverse magnetic field in the plane of said ring.

19. The method of claim 14 wherein said permanant magnetic material is selected from a group consisting of rare earth cobalt alloys, ceramic ferrite alloys, and rare earth iron alloys.

20. A method for fabricating a multipart rectangular-shaped permanent magnet having an easy axis of magnetization oriented in a selected angle relative to the easy axis of magnetization of its constituent parts, said method comprising the steps of:
    A. providing a rectangular-shaped magnet with an easy axis of magnetization parallel to a first surface thereof,
    B. cutting said magnet through an edge of said first surface at a selected angle relative to the easy axis of magnetization of said rectangular-shaped magnet thereby forming a first element and a second element from said rectangular-shaped magnet, each element including a portion of said first surface,
    C. cutting said first element through said portion of said first surface at an angle perpendicular to the surface formed by the first cut to form a third element and a fourth element, said cut also passing through an edge of said magnet; and
    D. reassembling said second, third and fourth elements to form a new rectangular-shaped magnet having an easy axis of magnetization rotated by said selected angle relative to the easy axis of magnetization relative to the original rectangular-shaped magnet.

21. The method of claim 19 wherein said rectangular-shaped magnet comprises a prism having a square cross-section.

22. The method of claim 20 wherein said prism is assembled of a plurality of rectangular geometric solids, each of said geometric solids having an easy axis of magnetization parallel to said first surface, said geometric solids assembled to form said prism such that the easy axis of magnetization of each geometric solid is aligned parallel to the easy axis of magnetization of said prism.

23. The method of claim 19 wherein said easy axis of magnetization of said rectangular-shaped magnet is substantially parallel to an edge of said magnet.

24. The method of claim 22 wherein said selected angle is constrained to values of 360/R degrees where R is an integer greater than 1.

* * * * *